United States Patent
Blumhagen et al.

(10) Patent No.: US 8,810,243 B2
(45) Date of Patent: Aug. 19, 2014

(54) METHOD FOR IMAGING A PORTION OF AN EXAMINATION OBJECT IN A MAGNETIC RESONANCE SCANNER

(75) Inventors: Jan Ole Blumhagen, Erlangen (DE); Matthias Fenchel, Erlangen (DE); Ralf Ladebeck, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 443 days.

(21) Appl. No.: 13/226,022

(22) Filed: Sep. 6, 2011

(65) Prior Publication Data

US 2012/0056621 A1  Mar. 8, 2012

(30) Foreign Application Priority Data

Sep. 7, 2010 (DE) .................. 10 2010 044 520

(51) Int. Cl.
*G01V 3/00* (2006.01)

(52) U.S. Cl.
USPC ........................................ 324/309; 324/307

(58) Field of Classification Search
CPC ...................................................... G01R 33/483
USPC ........................................ 324/309, 307, 306
See application file for complete search history.

(56) References Cited

U.S. PATENT DOCUMENTS

| | | | | |
|---|---|---|---|---|
| 4,591,789 | A * | 5/1986 | Glover et al. | 324/307 |
| 6,538,443 | B2 * | 3/2003 | Morich et al. | 324/318 |
| 6,897,655 | B2 * | 5/2005 | Brittain et al. | 324/309 |
| 6,967,479 | B2 * | 11/2005 | Polzin et al. | 324/318 |
| 2011/0187364 | A1 | 8/2011 | Blumhagen et al. | |
| 2013/0082702 | A1 * | 4/2013 | Blumhagen et al. | 324/309 |

FOREIGN PATENT DOCUMENTS

DE    102010006431 A1    8/2011

OTHER PUBLICATIONS

Langlois S. et al.; MIR Geometric Distortion: A Simple Approach to Correcting the Effects of Non-Linear Gradient Fields, JMRI 9: pp. 821-831, 1999; Magazine.
Doran, S. et al: "A Complete distortion correction for MR images: I. Gradient warp correction", Physics in Medicine and Biology 50, 2005, p. 1343-1361; Others; 2005.
Gaspar Delco et al.: "Impact of limited MR field-of-view in simultaneous PET/MR acquisition"; The Journal of Nuclear Medicine, 2008; 49; 162P; http://jnumedmtg.snmjournals.org/cgi/content/meeting_abstract/49/MeetingAbstracts_1/162P-b; Others; 2008.
Reinsberg et al, "A complete distortion correction for MR images: II. Rectification of static-field inhomogeneities by similarity-based profile mapping", Phys Med. Biol. Jun. 7, 2005; 50(11):2651-61; Others; 2005.
Bakker CJ et al.: "Analysis of machine-dependent and object-induced geometric distortion in 2DFT MR imaging" in Magn Reson Imaging, 1992, vol. 10(4), pp. 597-608; Others; 1992.

* cited by examiner

*Primary Examiner* — Louis Arana
(74) *Attorney, Agent, or Firm* — Harness, Dickey & Pierce, P.L.C.

(57) ABSTRACT

A method is disclosed for imaging a portion of an examination object in a magnetic resonance scanner. The portion is arranged at the edge of a field of view of the magnetic resonance scanner. During at least one embodiment of the method, a gradient field is produced such that a nonlinearity in the gradient field and a $B_0$-field inhomogeneity cancel at a predetermined point at the edge of the field of view. Magnetic resonance data, which contains the predetermined point at the edge of the field of view, is acquired with the aid of the gradient field. An image of the portion of the examination object at the predetermined point is determined from the magnetic resonance data.

21 Claims, 5 Drawing Sheets

FIG 3
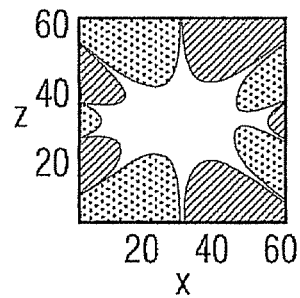
a)
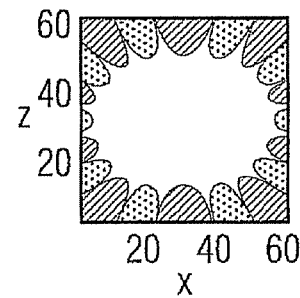
b)
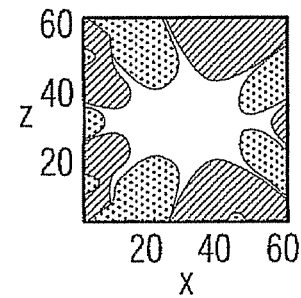
c)
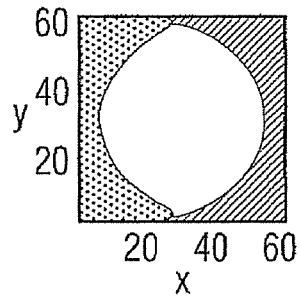
d)
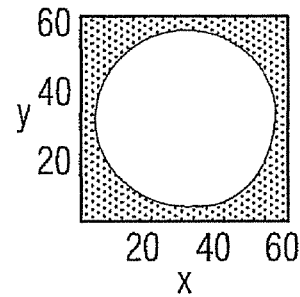
e)
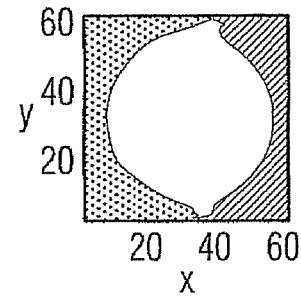
f)

FIG 4
a) 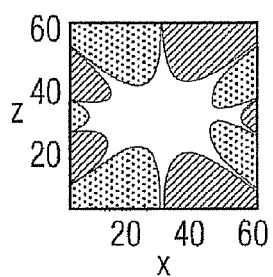
b) 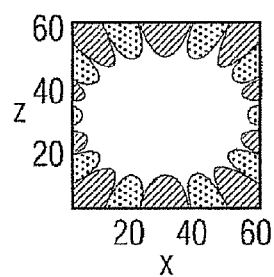
c) 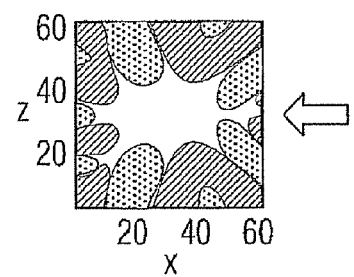
d) 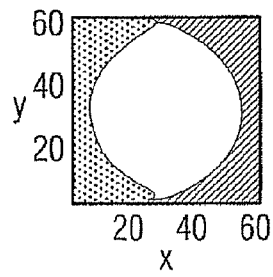
e) 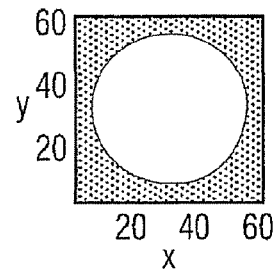
f) 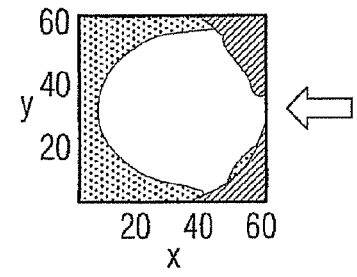

METHOD FOR IMAGING A PORTION OF AN EXAMINATION OBJECT IN A MAGNETIC RESONANCE SCANNER

PRIORITY STATEMENT

The present application hereby claims priority under 35 U.S.C. §119 on German patent application number DE 10 2010 044 520.7 filed Sep. 7, 2010, the entire contents of which are hereby incorporated herein by reference.

FIELD

At least one embodiment of the present invention generally relates to a method for imaging a portion of an examination object in a magnetic resonance scanner, and/or a magnetic resonance scanner for this.

BACKGROUND

The measurable volume of a magnetic resonance imaging recording is limited in all three spatial directions in a magnetic resonance scanner as a result of physical and technical conditions such as e.g. a limited magnetic-field homogeneity and a nonlinearity in the gradient field. Therefore a recording volume—a so-called field of view (FoV)—is restricted to a volume in which the aforementioned physical features lie within a predetermined tolerance range and hence afford the possibility of using conventional measurement sequences for faithful imaging of the object to be examined. However, the field of view restricted thereby is significantly shorter than that volume delimited by the ringed tunnel of the magnetic resonance scanner, particularly in the x- and y-directions, i.e. perpendicularly to a longitudinal axis of a tunnel of the magnetic resonance scanner. In the case of conventional magnetic resonance scanners, a diameter of the ringed tunnel is e.g. approximately 60 cm, whereas the diameter of the conventionally used field of view, within which the aforementioned physical features lie within the tolerance range, is approximately 50 cm.

In many applications of magnetic resonance scanners this inadequacy—the fact that there cannot be a faithful image of the measurement object in the edge region of the tunnel of the magnetic resonance scanner—does not constitute a major problem because, if there is only a magnetic resonance recording, the region of the object to be examined can usually be arranged in the magnetic resonance scanner such that this region is not situated at the edge of the tunnel but rather in the center of the tunnel where possible, in the so-called isocenter of the magnetic resonance scanner. However, in the case of hybrid systems, such as e.g. a hybrid system consisting of a magnetic resonance imaging scanner and a positron emission tomography scanner—a so-called MR/PET hybrid system—it is often of the utmost importance to determine structures of the examination object as precisely as possible, even in the edge region.

By way of example, in the case of a MR/PET hybrid system, the human attenuation correction is of decisive importance. The human attenuation correction is used to establish the intensity attenuation of the photons, which are emitted after an interaction between positrons and electrons, on their path through absorbing tissue to the detector and the received signal from the PET is corrected by precisely this attenuation. To this end a magnetic resonance recording is acquired, which images the complete anatomy of the object to be examined in the direction of the high-energy photons emitted by the positron emission tomography.

Thus, the anatomy of the object to be examined should also be ascertained as precisely as possible in the edge region of the tunnel of the hybrid system. Structures that are situated in these regions are for example mainly the arms in the case of patients to be examined, which arms may be arranged in the edge region in the vicinity of the tunnel inner wall in the hybrid system.

In the patent application with the application number DE 10 2010 006 431.9, from the same inventor and the entire contents of which are hereby incorporated herein by reference, a method is provided for determining a position of a portion of an examination object in a magnetic resonance scanner. The portion of the examination object is arranged at the edge of the field of view of the magnetic resonance scanner. In the method, at least one slice position for a magnetic resonance image is determined automatically, in which slice position the $B_0$ field at the edge of the magnetic resonance image satisfies a predetermined homogeneity criterion. Furthermore, a magnetic resonance image is recorded in the specific slice position, which contains the portion at the edge of the field of view. The position of the portion of the examination object is determined automatically by the position of the portion in the recorded magnetic resonance image.

Furthermore, the prior art has proposed a method by Delso et al. for compensating the missing information in the magnetic resonance image, which information is missing as a result of the limited field of view, by segmenting the body contours using uncorrected PET data (G. Delso et al., Impact of limited MR field-of-view in simultaneous PET/MR acquisition, J. Nucl. Med. Meeting Abstracts, 2008; 49, 162P).

Since the field of view in a magnetic resonance scanner is limited to a volume in which the magnetic field inhomogeneity and the nonlinearity of the gradient field lie within specified ranges, the prior art has presented different correction algorithms for extending the field of view. By way of example, a gradient distortion correction is proposed in Langlois S. et al., MRI Geometric Distortion: a simple approach to correcting the effects of non-linear gradient fields, J. Magn. Reson. Imaging 1999, 9(6), 821-31 and in Doran S J et al., A complete distortion correction for MR images: I. Gradient warp correction, Phys. Med. Biol. 2005 Apr. 7, 50(7), 1343-61. Furthermore, a corresponding $B_0$-field correction is proposed in Reinsberg S A, et al., A complete distortion correction for MR images: II. Rectification of static-field inhomogeneities by similarity-based profile mapping, Phys. Med. Biol. 2005 Jun. 7 50(11), 2651-61.

SUMMARY

However, a field-of-view extension for an application in the case of a whole body MR/PET has not been disclosed in the prior art. Hence in at least one embodiment of the present invention, a suitable, faithful image of structures of an object to be examined is provided, which structures are in a region outside of the usual field of view, i.e. for example in an edge region of a ringed tunnel in the magnetic resonance scanner.

In the case of strong distortions in these edge regions, in which the $B_0$ field has inhomogeneities and the gradient field has nonlinearities, it often proves impossible to compensate for the distortion in the magnetic resonance recording retrospectively because the distorted regions superpose in the magnetic resonance recording. Therefore in at least one embodiment of the present invention strong distortions are avoided already at the time when the magnetic resonance data is acquired.

According to at least one embodiment of the invention, a method is disclosed for imaging a portion of an examination object in a magnetic resonance scanner, a magnetic resonance scanner is disclosed, a computer program product is disclosed, and an electronically readable data medium is disclosed. The dependent claims define preferred and advantageous embodiments of the invention.

According to at least one embodiment of the present invention, provision is made for a method for imaging a portion of an examination object in a magnetic resonance scanner. The portion is arranged at the edge of a field of view of the magnetic resonance scanner. During the method a gradient field is generated such that a distortion caused by a nonlinearity in the gradient field and a distortion caused by a $B_0$-field inhomogeneity cancel at a predetermined point at the edge of the field of view. Then magnetic resonance data, which contains the predetermined point at the edge of the field of view, is acquired with the aid of the thus generated gradient field and an image of the portion of the examination object at the predetermined point is determined from the magnetic resonance data.

As per at least one embodiment of the present invention, provision is furthermore made for a computer program product that can be loaded into a storage medium of a programmable control of a magnetic resonance scanner. The computer program product may more particularly comprise software. Program segments of this computer program product can carry out all above-described embodiments of the method according to at least one embodiment of the invention when the computer program product is executed in the magnetic resonance scanner.

At least one embodiment of the present invention furthermore provides an electronically readable data medium, e.g. a CD or DVD, on which control information that can be read electronically, more particularly software, is stored. When this control information from the data medium is read and stored in a control unit of the magnetic resonance scanner, all embodiments according to the invention of the methods described above can be executed by the magnetic resonance scanner.

BRIEF DESCRIPTION OF THE DRAWINGS

In the following text, the present invention will, with the aid of the drawings, be explained on the basis of example embodiments.

FIG. 3 shows a distortion, simulated in an example fashion, with a readout direction in the x-direction using a readout gradient that was not generated in accordance with an embodiment of the present invention.

FIG. 4 shows a distortion, simulated in an example fashion, with a readout direction in the x-direction using a readout gradient that was generated in accordance with an embodiment of the present invention.

DETAILED DESCRIPTION OF THE EXAMPLE EMBODIMENTS

Figure 1:
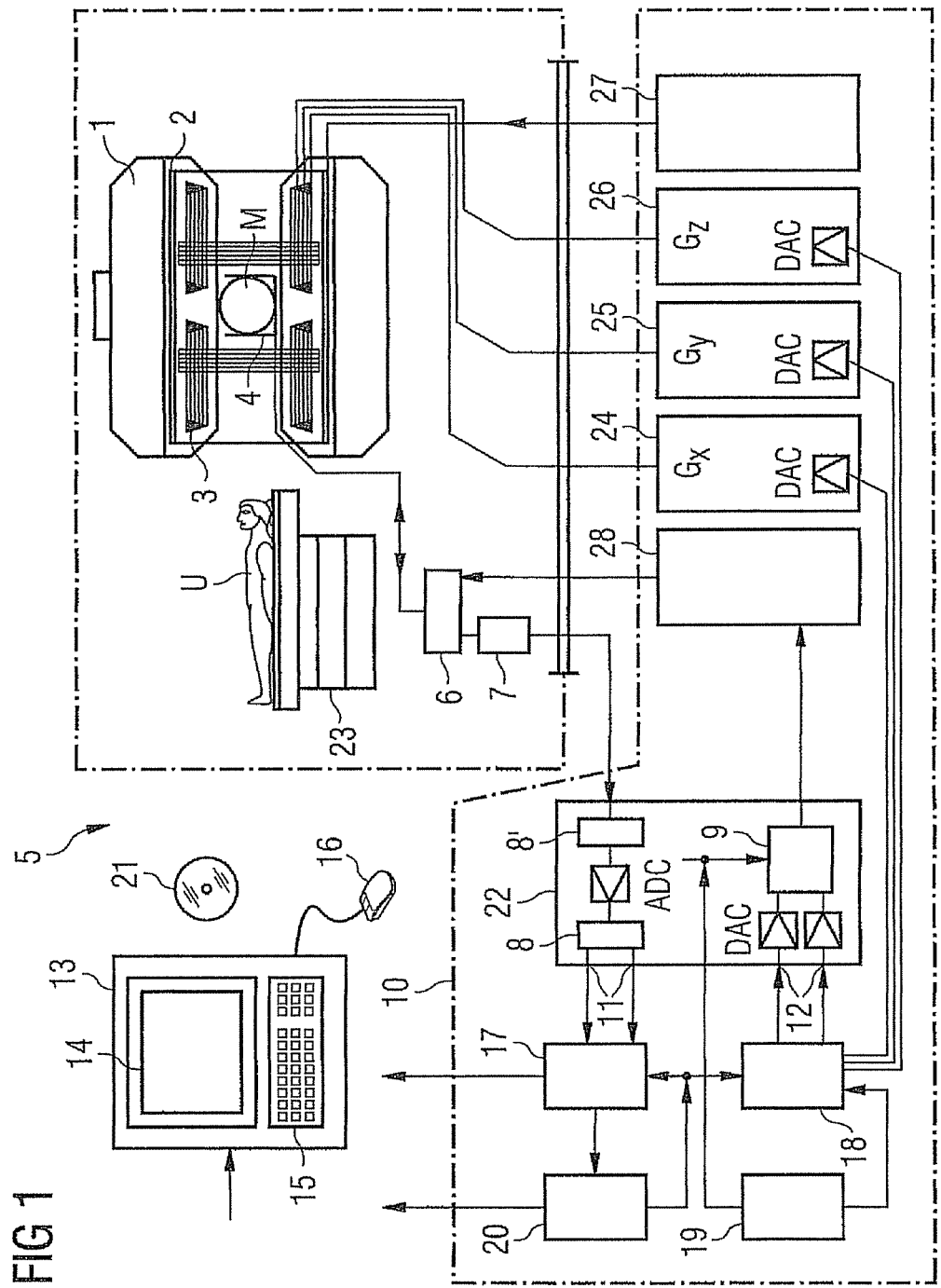
FIG. 1 schematically shows a magnetic resonance scanner as per an embodiment of the present invention.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

FIG. 1 shows a schematic illustration of a magnetic resonance scanner 5 (a magnetic resonance imaging scanner or a nuclear magnetic resonance scanner). Here, a basic field magnetic 1 generates a strong magnetic field, constant in time, for polarizing or aligning the nuclear spins in an examination region of an examination object U, such as e.g. a part of a human body to be examined, which body lies on a table 23 and is pushed into the magnetic resonance scanner 5. The large degree of homogeneity of the basic magnetic field, required for the nuclear magnetic resonance measurement, is defined within a typically spherical measurement volume M, into which the parts of the human body to be examined are introduced. In order to support the requirements in terms of homogeneity and more particularly to eliminate time-unvarying influences, so-called Shim foils made of a ferromagnetic material are attached at suitable locations. Time-varying influences are eliminated by Shim coils 2 and suitable actuation means 27 for the Shim coils 2.

A cylindrical gradient coil system 3, which includes three partial windings, is introduced into the basic field magnet 1. An appropriate amplifier 24-26 supplies current to each partial winding for generating a linear gradient field in the respective direction of a Cartesian coordinate system. The first partial winding of the gradient field system 3 in this case generates a gradient $G_x$ in the x-direction, the second partial winding generates a gradient $G_y$ in the y-direction, and the third partial winding generates a gradient $G_z$ in the z-direction. The amplifiers 24-26 respectively comprise a digital/analog converter (DAC), which is actuated by a sequential control 18 for generating gradient pulses at the right time.

Within the gradient field system 3 there is a radiofrequency antenna 4, which converts the radiofrequency pulses emitted by a radiofrequency power amplifier into an alternating magnetic field for exciting the nuclei and aligning the nuclear spins of the object to be examined or the region to be examined of the object. The radiofrequency antenna 4 includes one or more RF transmission coils and a plurality of RF reception coils in the form of an e.g. annular, linear, or matrix-like arrangement of coils. The RF reception coils of the radiofrequency antenna 4 also convert the alternating field arising from the precessing nuclear spins, i.e. generally the nuclear spin echo signals caused by a pulse sequence of one or more radiofrequency pulses and one or more gradient pulses, into a voltage (measurement signal), which is fed to a radiofrequency reception channel 8, 8' in a radiofrequency system 22 via an amplifier 7.

The radiofrequency system 22 furthermore comprises a transmission channel 9, in which the radiofrequency pulses for exciting the nuclear magnetic resonance are generated. In the process, the respective radiofrequency pulses are represented digitally as a sequence of complex numbers in the sequential control 18 as a result of a pulse sequence prescribed by the installation computer 20. This sequence of numbers is fed as real and imaginary part via respectively one input 12 to a digital/analog converter (DAC) in the radiofrequency system 22 and from there it is fed to the transmission channel 9. In the transmission channel 9 the pulse sequences are modulated onto a radiofrequency carrier signal, the base frequency of which corresponds to the resonant frequency of the nuclear spins in the measurement volume. The modulated pulse sequences from the RF transmission coil are fed to the radiofrequency antenna 4 via an amplifier 28.

The switch-over between transmission and reception operation is brought about via a transmission/reception switch 6. The RF transmission coil of the radiofrequency antenna 4 radiates the radiofrequency pulses into the measurement volume M in order to excite the nuclear spins and scans the resulting echo signals via the RF reception coils. The correspondingly obtained nuclear resonance signals are in a first demodulator 8' in the reception channel of the radiofrequency system 22 demodulated in a phase-sensitive fashion to an intermediate frequency and digitized in the analog/digital converter (ADC). This signal is still demodulated to the zero frequency. The demodulation to the zero frequency and the splitting into real and imaginary parts takes place after the digitization in the digital domain in a second demodulator 8, which outputs the demodulated data to an image computer 17 via the outputs 11.

The image computer 17 reconstructs an MR image from the measurement data obtained in this fashion. The measurement data, the image data, and the control programs are administered by the installation computer 20. Due to a prescription with control programs, the sequential control 18 controls the generation of the respectively desired pulse sequences and the corresponding scanning of the k-space.

More particularly, the sequential control 18 in the process controls the switching of the gradients at the right time, the emission of the radiofrequency pulses with a defined phase amplitude, and the reception of the nuclear magnetic resonance signals. The time base for the radiofrequency system 22 and the sequential control 18 is provided by a synthesizer 19. The selection of appropriate control programs for producing an MR image, which are e.g. stored on a DVD 21, and the display of the generated MR image are brought about via a terminal 13, which comprises a keyboard 15, a mouse 16, and a monitor 14.

The measurement volume M, which is also referred to as the field of view (FoV), is restricted in terms of hardware by the $B_0$-field homogeneity and the linearity of the gradient field. Measurements outside of this measurement volume, i.e. in regions in which the $B_0$ field has inhomogeneities and the gradient field has nonlinearities, lead to strong distortions, i.e. regions of the examination object arranged outside of the measurement volume M do not appear in the magnetic resonance image at the point at which they are actually situated but at a position offset therefrom.

In the case of a magnetic resonance imaging scanner with for example a tube diameter of 60 cm, the measurement volume M usually has a diameter of for example 50 cm, i.e. the distortion arises in a region of approximately 5 cm along in an edge region along the internal circumference of the tomography scanner. However, the arms of a patient, for example, may be situated in this region. As a result of the distortion the position of the arms of the patient is incorrectly reproduced in the magnetic resonance recording. Hence the magnetic resonance recordings in this region cannot be used for human attenuation correction in MR/PET hybrid systems.

The distortions that occur in this edge region are dependent on the field deviation $dBg$ or $dB_0$ with respect to the setpoint value and on the gradient field strength G. This relationship is known from Bakker CJ, et al., *Analysis of machine-dependent and object-induced geometric distortion in 2DFTMR imaging*, Magn Reson Imaging, 1992, 10(4): 597-608, the entire contents of which are hereby incorporated herein by reference. The following equations describe, in an exemplary fashion, a 2-dimensional magnetic-resonance data acquisition with slice selection in the z-direction, phase encoding in the y-direction and frequency encoding in the x-direction. The phase-encoding direction, the frequency-encoding direction, and the slice-selection direction can be selected freely and merely match the position of the axes to the equations.

$$z_1 = z + dB_{gz}(x,y,z)/G_z + dB_0(x,y,z)/G_z \quad (2)$$

$$x_1 = x + dB_{gx}(x,y,z)/G_x + dB_0(x,y,z)/G_x \quad (3)$$

$$y_1 = y + dB_{gy}(x,y,z)/G_y \quad (4)$$

The coordinates (x, y, z) describe the actual positions and the coordinates $(x_1, y_1, z_1)$ describe the distorted positions.

FIG. 3 shows a simulation of the distortion in the x-direction with a switched-on readout gradient in the x-direction of $G_x=10$ mT/m in a coronal slice view as a result of the gradient field (FIG. 3a), the $B_0$ field (FIG. 3b) and the superposition of the two fields (FIG. 3c), and in a transverse slice view as a result of the gradient field (FIG. 3d), the $B_0$ field (FIG. 3e) and the superposition of the two fields (FIG. 3f).

In FIG. 3, the distortions are characterized by different filling patterns. Regions with substantially no distortion remain without a pattern, regions with positive distortion are dotted and regions with negative distortion are hatched. The distortion may have different values within the respective regions.

In the regions without a pattern, i.e. in the regions that substantially have no distortion, the distortion is for example less than +/−1 mm. In the dotted regions, the distortion is for example between +1 mm and +20 mm, or even more. In the hatched regions, the distortion is for example between −1 mm and −20 mm, or even more. In general there is a continuous distortion, i.e. the distortion grows outward in the regions at a distance from the isocenter, wherein the isocenter in FIG. 3 for example lies at x=30, y=30, and z=30.

Since the nonlinearities dBg of the gradient field scale with the gradient-field strength, the distortion at a specific point or in a specific region can be reduced or compensated for in a targeted fashion, as illustrated below. The following holds true:

$$dB_{gx} = c(x,y,z) \cdot G_x, \quad (5)$$

where c(x, y, z) denotes the relative gradient error at the point x, y, z and $G_x$ represents the gradient-field strength. However, the $B_0$-field inhomogeneities are constant, independent of the gradient strength. Hence, the term $dB_{gx}/G_x$ is constant and independent of the gradient-field strength. However, the term $dB_0/G_x$ is changeable with the gradient-field strength.

As per an embodiment of the present invention, the magnetic fields are therefore superposed such that the nonlinearity in the gradient field and the $B_0$-field inhomogeneity destructively superpose at a predetermined point or in a predetermined region. This will be described below in an example fashion for a readout gradient in the x-direction with a slice selection in the z-direction. The required destructive superposition of the magnetic fields succeeds if there is an optimum gradient strength $G_{x\_opt}$ for which the distortion at the predetermined point or within the predetermined region is zero. In the case of a distortion of zero in the x-direction, the following holds true:

$$x_1 = x.$$

This leads to:

$$G_{x\_opt} = -dB_0(x,y,z)/c(x,y,z) \quad (6)$$

If the gradient field strength $G_x$ is selected as described in equation (6), this results in a significantly enlarged field of view for the predetermined position or the predetermined region, i.e. there is a significant reduction in the distortion in this region. FIG. 4 shows, in an example fashion, a simulated distortion in the case of a readout gradient in the x-direction with a readout gradient $G_x=4.3$ mT/m, which was determined as per equation (6). Comparable with FIG. 3, FIG. 4a shows the distortion in a coronal slice as a result of the gradient field, FIG. 4b shows the distortion in the coronal slice as a result of the $B_0$ field, and FIG. 4c shows the distortion in the x-direction when the two fields are superposed.

Accordingly, FIG. 4d shows the distortion in the x-direction in a transverse slice as a result of the gradient field, FIG. 4e shows the distortion in the transverse slice as a result of the $B_0$ field, and FIG. 4f shows the distortion as a result of the superposition of the two fields in the transverse slice. At the position respectively marked in FIGS. 4c and 4f by the arrow, the nonlinearity of the gradient field and the inhomogeneity of the $B_0$ field superpose precisely such that the distortion there approaches zero.

Figure 5:
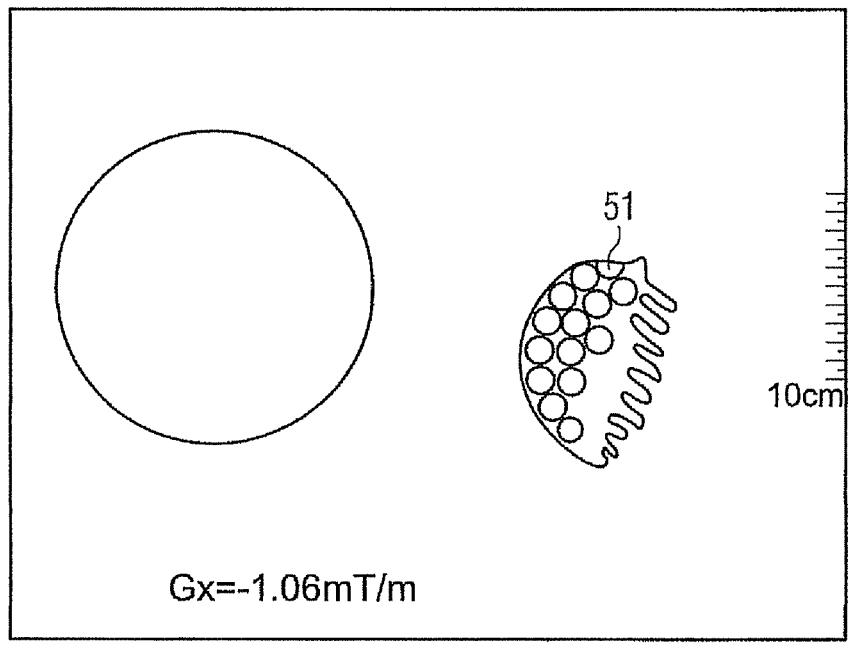
FIG. 5 shows a transverse layer magnetic resonance recording of a cylindrical structure phantom, which recording was generated with a gradient that was not generated in accordance with an embodiment of the present invention.
Figure 6:
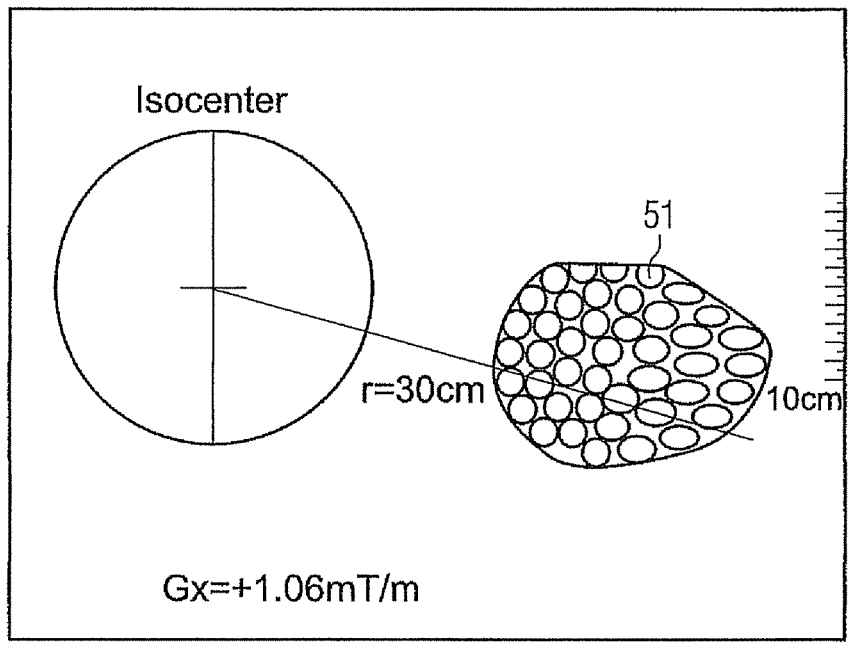
FIG. 6 shows a transverse layer magnetic resonance recording of the cylindrical structure phantom from FIG. 5, which was recorded using a gradient that was generated in accordance with an embodiment of the present invention.

FIGS. 5 and 6 show results of trials with the aid of a structure phantom 51, which confirm the possibility of destructively superposing the nonlinearity of the gradient with the inhomogeneity of the $B_0$ field. FIGS. 5 and 6 show transverse slices with different gradient polarities. While the nonlinearity of the gradient and the $B_0$-field inhomogeneity compensate one another in the case of an optimally selected gradient strength (FIG. 6), and therefore result in a very small distortion, the distortions are extremely amplified in the case of an opposite gradient polarity. The cylindrical structure phantom 51, which is arranged at the edge of the tomography-scanner tube at x=30 cm, is shown in a much distorted fashion in the case of an inexpediently selected readout gradient of $G_x=-1.06$ mT/m, as shown in FIG. 5. In the case of an optimally selected readout gradient of e.g. $G_x=+1.06$ mT/m, the phantom object 51 and the structure thereof are also illustrated with little distortion in the edge region of the tomography scanner, as shown in FIG. 6.

Figure 2:
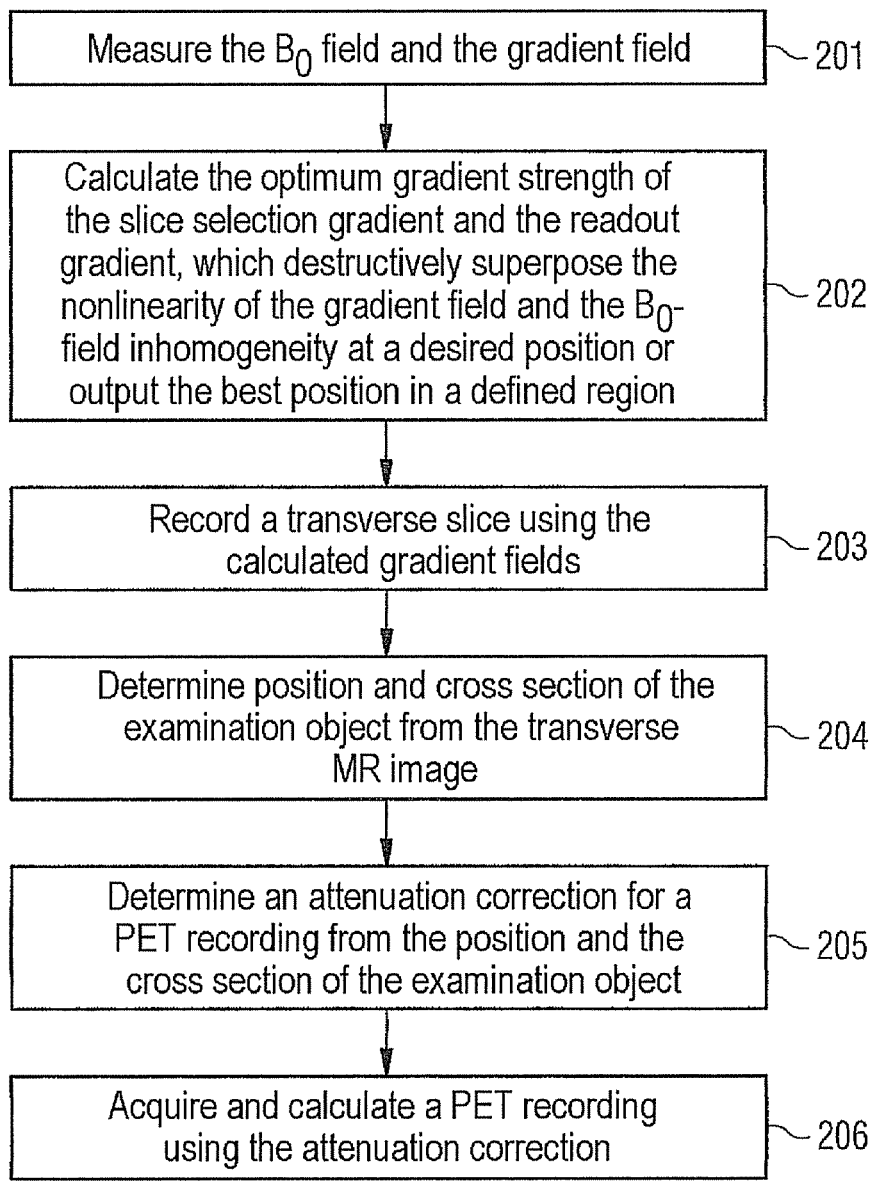
FIG. 2 shows a flowchart of a method according to an embodiment of the invention.

The above-described method can for example be advantageously used for the human attenuation correction in an MR/PET hybrid system. The method described in conjunction with FIG. 2 leads to an enlarged magnetic-resonance-based field of view and thus also supports the MR/PET attenuation correction with magnetic resonance data from outside of the usually specified field of view of the magnetic resonance system. To this end, as illustrated in step 201, the $B_0$ field and the gradient field of the magnetic resonance scanner are firstly determined in order to determine the $B_0$-field inhomogeneities and the relative gradient fields of the magnetic resonance scanner. Then an optimum gradient strength of the slice selection gradient and the readout gradient is determined in step 202, as a result of which the nonlinearity of the gradient field and the $B_0$-field inhomogeneity are destructively superposed at a desired position. A transverse slice is recorded in step 203 using the calculated gradient fields.

A position and a cross section of the examination object are determined in step 204 from the transverse magnetic resonance image. Steps 202-204 can optionally be carried out successively for different desired positions in order to establish as precisely as possible an overall arrangement of the examination object in the magnetic resonance scanner. An attenuation correction for the PET recording is determined in step 205 from the established position and the established cross section of the examination object. Finally, PET data is acquired in step 206 and a PET recording is calculated therefrom using the attenuation correction.

By way of example, the gradient field can be a readout gradient field or a slice-selection gradient field.

Since the nonlinearity of the gradient field depends on the gradient field strength and the $B_0$-field inhomogeneities are independent of the gradient field strength, the gradient field can, at least for a predetermined point in the field of view or a predetermined region of the field of view, be set and generated such that the nonlinearity in the gradient field and the $B_0$-field inhomogeneity cancel at this point or in this region. As a result, a distortion can be avoided for this predetermined point or for the predetermined region.

In this context, distortion means that a signal value at a predetermined point (x, y, z) in the examination object, for example at a predetermined point at the edge of the field of view, appears at a different point $(x_1, y_1, z_1)$ in the image of the examination object determined from the acquired magnetic resonance data. The coordinates (x, y, z) are also referred to as the actual position and the coordinates $(x_1, y_1, z_1)$ are also referred to as the distorted position. Distortions that cannot be compensated for by retrospective rectification of the image of the examination object can occur particularly in the edge regions of the field of view because, for example, a plurality of adjacent actual positions can be imaged on one or more of the distorted positions that are situated closely next to one another. By the nonlinearity of the gradient field and the $B_0$-field inhomogeneity canceling one another at a predetermined point or region by generating a suitable gradient field, there are no or only small distortions in this region, and so a usable image of the examination object may be determined in this region.

As per one embodiment, a relative gradient error is determined at the predetermined point at the edge of the field of view for generating the gradient field. Furthermore, the $B_0$-field inhomogeneity is determined at the predetermined point. By way of example, the relative gradient error and the $B_0$-field inhomogeneity can be determined in advance by measuring the magnetic resonance scanner. The gradient of the gradient field is then determined dependent on the relative gradient error and the $B_0$-field inhomogeneity and generated accordingly when the magnetic resonance data is acquired.

The gradient G of the gradient field can be determined as per the following equation:

$$G = -dB_0(x,y,z)/c(x,y,z), \quad (1)$$

where $dB_0$ is the $B_0$-field inhomogeneity at the predetermined point (x, y, z) at the edge of the field of view and c is the relative gradient error at the predetermined point (x, y, z). When the magnetic resonance scanner has been measured once, i.e. once the relative gradient error and the $B_0$-field inhomogeneity was determined for specific points or regions, e.g. regions in which the arms of the patient are expected to be situated, the gradients of the gradient field can therefore be determined and generated in a simple fashion in order to be able to determine an image of the examination object at the predetermined point in a reliable fashion, i.e. without distortion.

As per a further embodiment, the $B_0$-field inhomogeneity at the predetermined point at the edge of the field of view is determined in order to generate the gradient field and a gradient coil for generating the gradient field is embodied such that a nonlinearity of the gradient field and the $B_0$-field inhomogeneity cancel at the predetermined point. Since, for example, the attenuation correction usually only needs to be ascertained without distortions at a few regions at the edge of the field of view of the magnetic resonance scanner, e.g. in regions where the arms of the patient are expected to be situated, for a PET attenuation correction, a gradient coil can be optimized to the effect that the inhomogeneity of the gradient coil in a predetermined gradient field substantially cancels the $B_0$-field inhomogeneity in these regions. This can achieve a distortion-free image of the examination object in these predetermined regions.

As per a further embodiment, the nonlinearity of the gradient field is determined at the predetermined point at the edge of the field of view in order to generate the gradient field and the $B_0$ field is modified such that the nonlinearity of the gradient field and the $B_0$-field inhomogeneity cancel at the predetermined point. By way of example, the $B_0$ field can be modified by suitably arranging so-called Shim foils. As a result, it is possible to achieve low or even no distortion in at least a few predetermined regions, for example regions in which the arms of the patient are situated as expected.

The method can more particularly be used in the case of a magnetic resonance scanner with a tunnel-shaped opening for accommodating the examination object. The edge of the field of view of this magnetic resonance scanner in this case comprises a case-shaped region along an internal surface of the tunnel-shaped opening. By way of example, the casing region may have a casing thickness of approximately 5 cm. As mentioned above, the portion of the examination object to be imaged may comprise an anatomical structure of the patient, more particularly e.g. an arm of the patient, which arm is arranged at the edge of the field of view of the magnetic resonance scanner. The magnetic resonance data is preferably acquired in a transverse plane with respect to the examination object. As a result of the low distortion, the position of the portion in the specific image of the examination object can be reliably determined.

As per a further embodiment, an attenuation correction is determined for a positron emission tomography, dependent on a position of the portion of the examination object. As a result of the low distortion, the position of the portion, e.g. an arm, can be reliably determined from the image of the examination object. In the case of a positron emission tomography, allowing for an attenuation of the received radiation (photons) through the structure or anatomy of the examination object in the beam direction is of decisive importance. By also being able to determine the position of the portion of the examination object at the edge of the field of view of the magnetic resonance scanner, it is possible to determine the entire position and structure of the examination object or patient in the magnetic resonance scanner and thus a precise attenuation correction is achievable for a positron emission tomography. Since the attenuation correction in this case is only based on information from the magnetic resonance image, a positron emission tomography can also be carried out with less strongly enriched PET tracers, such as e.g. rubidium.

Determining the position of the portion of the examination object at the edge of the field of view of the magnetic resonance scanner likewise makes it possible to support radiotherapy planning.

As per at least one embodiment of the present invention, provision is furthermore made for a magnetic resonance scanner, which comprises a control apparatus for actuating a scanner with a magnet for generating a $B_0$ field, a reception device for receiving signals recorded by the scanner, and an evaluation device for evaluating the signals and producing magnetic resonance images.

In at least one embodiment, the magnetic resonance scanner is able to generate a gradient field such that a nonlinearity of the gradient field and a $B_0$-field inhomogeneity cancel at a predetermined point at the edge of the field of view. By way of example, a portion of an examination object, which, should be imaged with the aid of the magnetic resonance scanner, may be situated at the edge of the field of view. The magnetic resonance scanner is furthermore embodied such that, with the aid of the gradient field, it acquires magnetic resonance data that contains the predetermined point at the edge of the field of view. The magnetic resonance scanner then uses the acquired magnetic resonance data to determine an image of the portion of the examination object at the predetermined point at the edge of the field of view.

The magnetic resonance scanner can furthermore comprise a positron emission tomography scanner and automatically determine an attenuation correction for a positron emission tomography dependent on the specific image of the examination object in the magnetic resonance scanner.

The magnetic resonance scanner can furthermore be embodied to carry out at least one embodiment of the above-described method and its embodiments, and therefore also comprises at least one of the above-described advantages.

Although example embodiments were described in the preceding description, various modifications can be implemented in further embodiments. By way of example, a 3-dimensional magnetic-resonance data acquisition is also possible using the above-described method of at least one embodiment of the present invention. Since the slice selection is in this case replaced by an additional phase encoding, the $B_0$ term in equations (2) to (4) would be dispensed with in the slice selection direction. As a result, one degree of freedom is lost in the above-described method; however, this could be compensated for using permutations.

In the above-described method, the shape of the magnetic field generated by the magnetic field coil and the gradient coil was assumed to be given and these field imperfections were brought to destructive superposition at a desired point to calculate an optimum gradient strength. Alternatively, there is the option of modifying the shape of the gradient coil in terms of its hardware such that the nonlinearity of the gradient field optimally counteracts the inhomogeneities of the main magnetic field. Accordingly, the $B_0$-field inhomogeneities can also be tuned to the nonlinearities of the gradient field by modifying the magnetic-field coil or the iron Shims.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a tangible computer readable medium and is adapted to perform any one of the aforementioned methods when run on a computer device (a device including a processor). Thus, the tangible storage medium or tangible computer readable medium, is adapted to store information and is adapted to interact with a data processing facility or computer device to execute the program of any of the above mentioned embodiments and/or to perform the method of any of the above mentioned embodiments.

The tangible computer readable medium or tangible storage medium may be a built-in medium installed inside a computer device main body or a removable tangible medium arranged so that it can be separated from the computer device main body. Examples of the built-in tangible medium include, but are not limited to, rewriteable non-volatile memories, such as ROMs and flash memories, and hard disks. Examples of the removable tangible medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

LIST OF REFERENCE SIGNS

1 Basic field magnet
2 Shim coil
3 Gradient field system

4 Radiofrequency antenna, component coil
5 Magnetic resonance scanner
6 Transmission/reception switch
7 Amplifier
8 Demodulator
8' Demodulator
9 Transmission channel
10 Control apparatus
11 Output
12 Input
13 Terminal
14 Monitor
15 Keyboard
16 Mouse
17 Image computer
18 Sequential control
19 Synthesizer
20 Installation computer
21 Data medium
22 Radiofrequency system
23 Table
24-26 Amplifier
27 Actuation means
28 Amplifier
51 Portion
201-206 Step
U Examination object

What is claimed is:

1. A method for imaging a portion of an examination object in a magnetic resonance scanner, wherein the portion is arranged at an edge of a field of view of the magnetic resonance scanner, the method comprising:
generating a gradient field such that a distortion caused by a nonlinearity in the gradient field and a distortion caused by a $B_0$-field inhomogeneity cancel at a point at the edge of the field of view;
acquiring magnetic resonance data, which contains the point at the edge of the field of view, by way of the gradient field; and
determining an image of the portion of the examination object at the point at the edge of the field of view from the magnetic resonance data.

2. The method as claimed in claim 1, wherein the generating the gradient field includes generating a readout gradient field.

3. The method as claimed in claim 2, wherein the generating the gradient field further comprises:
determining a relative gradient error at the point at the edge of the field of view, determining the $B_0$-field inhomogeneity at the point at the edge of the field of view, and
determining a gradient in the gradient field, dependent on the relative gradient error and the $B_0$-field inhomogeneity.

4. The method as claimed in claim 3, wherein the gradient is denoted as G and determined based on:

$$G = -dB_0(x,y,z)/c(x,y,z), \quad (1)$$

where $dB_0$ is the $B_0$-field inhomogeneity at the point (x, y, z) at the edge of the field of view and c is the relative gradient error at the point (x, y, z) at the edge of the field of view.

5. The method as claimed in claim 2, wherein the generating the gradient field further comprises:
determining the $B_0$-field inhomogeneity at the point at the edge of the field of view, and
designing a gradient coil for generating the gradient field such that a nonlinearity in the gradient field and the $B_0$-field inhomogeneity cancel at the point at the edge of the field of view.

6. The method as claimed in claim 2, wherein the generating the gradient field further comprises:
determining the nonlinearity in the gradient field at the point at the edge of the field of view, and
modifying the $B_0$ field such that the nonlinearity in the gradient field and a $B_0$-field inhomogeneity cancel at the point at the edge of the field of view.

7. The method as claimed in claim 1, wherein the generating the gradient field includes generating a slice-selection gradient field.

8. The method as claimed in claim 1, wherein the generating the gradient field further comprises:
determining a relative gradient error at the point at the edge of the field of view,
determining the $B_0$-field inhomogeneity at the point at the edge of the field of view, and
determining a gradient in the gradient field, dependent on the relative gradient error and the $B_0$-field inhomogeneity.

9. The method as claimed in claim 8, wherein the gradient is denoted as G and determined based on:

$$G = -dB_0(x,y,z)/c(x,y,z), \quad (1)$$

where $dB_0$ is the $B_0$-field inhomogeneity at the point (x, y, z) at the edge of the field of view and c is the relative gradient error at the point (x, y, z) at the edge of the field of view.

10. The method as claimed in claim 1, wherein the generating the gradient field further comprises:
determining the $B_0$-field inhomogeneity at the point at the edge of the field of view, and
designing a gradient coil for generating the gradient field such that a nonlinearity in the gradient field and the $B_0$-field inhomogeneity cancel at the point at the edge of the field of view.

11. The method as claimed in claim 1, wherein the generating the gradient field further comprises:
determining the nonlinearity in the gradient field at the point at the edge of the field of view, and
modifying the $B_0$ field such that the nonlinearity in the gradient field and a $B_0$-field inhomogeneity cancel at the point at the edge of the field of view.

12. The method as claimed in claim 1, wherein the portion of the examination object comprises an anatomical structure of a patient, the anatomical structure being arranged at the edge of the field of view of the magnetic resonance scanner.

13. The method as claimed in claim 12, wherein the anatomical structure comprises an arm of the patient.

14. The method as claimed in claim 1, wherein the magnetic resonance scanner includes a tunnel-shaped opening for accommodating the examination object, and wherein the edge of the field of view comprises a casing region along an internal surface of the tunnel-shaped opening.

15. The method as claimed in claim 14, wherein the casing region includes a casing thickness of approximately 5 cm.

16. The method as claimed in claim 1, wherein the acquiring acquires the magnetic resonance data in a transverse plane with respect to the examination object.

17. The method as claimed in claim 1, wherein an attenuation correction for positron emission tomography is determined dependent on the image of the portion of the examination object.

18. A magnetic resonance scanner, comprising:
a basic field magnet;
a gradient field system;
a radiofrequency antenna; and
a control apparatus configured to,
  actuate the gradient field system and the radiofrequency antenna,
  receive measurement signals recorded by the radiofrequency antenna,
  evaluate the measurement signals, and
  produce magnetic resonance images, wherein the magnetic resonance scanner is configured to,
generate a gradient field such that a nonlinearity in the gradient field and a $B_0$-field inhomogeneity cancel at a point at the edge of the field of view,
acquire magnetic resonance data, which contains the point at the edge of the field of view by way of the gradient field, and
determine an image of a portion of an examination object from the magnetic resonance data at the point at the edge of the field of view.

19. The magnetic resonance scanner as claimed in claim 18, wherein the magnetic resonance scanner is configured to carry out a method for imaging a portion of an examination object in a magnetic resonance scanner, wherein the portion is arranged at an edge of a field of view of the magnetic resonance scanner, the method comprising:
  generating a gradient field such that a distortion caused by a nonlinearity in the gradient field and a distortion caused by a $B_0$-field inhomogeneity cancel at a point at the edge of the field of view;
  acquiring magnetic resonance data, which contains the point at the edge of the field of view, by way of the gradient field; and
  determining an image of the portion of the examination object at the point at the edge of the field of view from the magnetic resonance data.

20. The magnetic resonance scanner as claimed in claim 18, wherein the magnetic resonance scanner further comprises a positron emission tomography scanner, and the magnetic resonance scanner is configured to carry out a method for imaging a portion of an examination object in a magnetic resonance scanner, wherein the portion is arranged at an edge of a field of view of the magnetic resonance scanner, the method comprising:
  generating a gradient field such that a distortion caused by a nonlinearity in the gradient field and a distortion caused by a $B_0$-field inhomogeneity cancel at a point at the edge of the field of view;
  acquiring magnetic resonance data, which contains the point at the edge of the field of view, by way of the gradient field; and
  determining an image of the portion of the examination object at the point at the edge of the field of view from the magnetic resonance data.

21. A non-transitory computer readable medium comprising a computer program product, the computer program product comprising instructions, which when executed by a processor, causes the processor to perform function including:
  generating a gradient field such that a distortion caused by a nonlinearity in the gradient field and a distortion caused by a $B_0$-field inhomogeneity cancel at a point at an edge of a field of view of a magnetic resonance scanner;
  acquiring magnetic resonance data, which contains the point at the edge of the field of view, by way of the gradient field; and
  determining an image of a portion of the examination object at the point at the edge of the field of view from the magnetic resonance data, the portion being arranged at the edge of the field of view of the magnetic resonance scanner.

* * * * *